US 7,161,804 B2

(12) United States Patent
Oyamada

(10) Patent No.: US 7,161,804 B2
(45) Date of Patent: Jan. 9, 2007

(54) HOUSING STRUCTURE OF ELECTRONIC DEVICE AND HEAT RADIATION METHOD THEREFOR

(75) Inventor: Takashi Oyamada, Tokyo (JP)

(73) Assignee: NEC Corporation, Tokyo (JP)

( * ) Notice: Subject to any disclaimer, the term of this patent is extended or adjusted under 35 U.S.C. 154(b) by 241 days.

(21) Appl. No.: 10/779,770

(22) Filed: Feb. 18, 2004

(65) Prior Publication Data

US 2004/0165352 A1    Aug. 26, 2004

(30) Foreign Application Priority Data

Feb. 26, 2003    (JP) .............................. 2003-049112

(51) Int. Cl.
*H05K 7/20*    (2006.01)
*F28F 7/00*    (2006.01)
*H01L 23/34*    (2006.01)

(52) U.S. Cl. ...................... 361/703; 361/710; 361/715; 165/80.3; 165/185; 257/722

(58) Field of Classification Search ................ 361/687, 361/704; 257/722; 165/80.2; 174/17 R, 174/17.05; 337/56, 66
See application file for complete search history.

(56) References Cited

U.S. PATENT DOCUMENTS 4,166,993 A * 9/1979 Krasser ........................ 337/66
4,233,645 A * 11/1980 Balderes et al. ............ 361/698
5,305,184 A * 4/1994 Andresen et al. ........... 361/699
7,040,383 B1 * 5/2006 Oyamada ................ 165/104.33
2001/0012212 A1 * 8/2001 Ikeda ......................... 363/141

FOREIGN PATENT DOCUMENTS

JP        7-176877       7/1995
JP       10-154888       6/1998

* cited by examiner

*Primary Examiner*—Lisa Lea-Edmonds
*Assistant Examiner*—Zachary Pape
(74) *Attorney, Agent, or Firm*—Young & Thompson

(57) ABSTRACT

A sealed housing is provided with a body, a cover, and a movable fin for radiating heat while suppressing a change in internal pressure, and preventing invasion of water vapor or poisonous gas from the exterior to thereby avoid an accident caused by dew condensation, and corrosion of an electrical circuit component. The movable fin automatically slides toward the inside or outside of the sealed housing depending on a change in internal atmospheric pressure of the sealed housing following a change in internal temperature thereof. When the temperature inside the sealed housing rises due to heat from the electrical circuit component mounted in a package inside the sealed housing, a heat radiation area of the movable fin increases while keeping sealing tightness so that a heat radiation effect can be enhanced.

29 Claims, 5 Drawing Sheets

HOUSING STRUCTURE OF ELECTRONIC DEVICE AND HEAT RADIATION METHOD THEREFOR

BACKGROUND OF THE INVENTION

1. Field of the Invention

The present invention relates to an electronic device such as a communication device and, in particular, relates to a housing structure of an electronic device having a sealed housing, and further to a heat radiation method therefor.

2. Description of the Related Art

With respect to a sealed housing used in an electronic device such as a communication device, a rise in temperature inside the housing is induced by heat generation from electrical circuit components mounted in a package or the like inside the housing, or due to a change in external environment. In order to suppress the rise in temperature to enhance reliability of an operation of the electronic device, the conventional sealed housing is provided with a heat radiation structure such as fins on the outer periphery of the housing. The heat radiation capacity of the housing is determined by a heat radiation effect of the heat radiation structure, and is so set as to exceed the total calorific value inside the housing. As the heat radiation structure, there is a cooling structure of an electronic device having an external heatsink exposed on the outer periphery of a sealed housing thereof, which is, for example, shown in FIG. 1 of JP-A-H10-154888.

On the other hand, in an electronic device having a sealed housing, when the temperature rises inside the housing, the atmospheric pressure inside the housing also increases, and therefore, a tetrafluoroethylene membrane filter (e.g. GORE-TEX), for example, may be attached to enhance reliability of an operation of the electronic device. Further, there is also such a housing that enhances reliability of an operation of an electronic device by employing a tube containing water to thereby suppress a change in atmospheric pressure, which is, for example, described in JP-A-H07-176877.

However, when, for example, the membrane filter is used, if water vapor or poisonous gas invades from the exterior passing through the membrane filter, dew condensation is resulted inside the housing. Consequently, there has been a problem of occurrence of a phenomenon such as corrosion of electrical circuit components inside the housing. On the other hand, if the tube containing water is employed for solving it, there has been a problem that no effect is achieved when the water is vaporized.

SUMMARY OF THE INVENTION

It is an object of the present invention to provide a housing structure of an electronic device and a heat radiation method therefor, which can improve a heat radiation effect of a sealed housing and prevent invasion of water vapor or poisonous gas thereinto from the exterior, thereby to solve the foregoing problems.

A housing structure of the present invention is a housing structure of an electronic device having an electrical circuit component in a sealed housing, and comprises a movable fin that protrudes to the outside of the sealed housing depending on a rise in internal temperature of the sealed housing.

Further, a housing structure of the present invention is a housing structure of an electronic device having an electrical circuit component in a sealed housing, and comprises a first hole formed in an upper part of the sealed housing and a second hole formed in a lower part thereof, and a bellows container with a variable internal volume that is connected between the first hole and the second hole.

Further, a housing structure of the present invention is a housing structure of an electronic device having an electrical circuit component in a sealed housing, and comprises a first hole formed in an upper part of the sealed housing and a second hole formed in a lower part thereof, and an expandable/contractible balloon that is connected between the first hole and the second hole.

As described above, according to the housing structure of the electronic device and its heat radiation method of the present invention, it is possible to increase the heat radiation effect of the sealed housing and simultaneously prevent an accident caused by dew condensation, corrosion of the electrical circuit component, or the like inside the sealed housing, so that reliability of an operation of the electronic device can be further enhanced.

BRIEF DESCRIPTION OF THE DRAWINGS

The above and other objects, features and advantages of the present invention will become more apparent from the following detailed description when taken in conjunction with the accompanying drawings wherein.

DETAILED DESCRIPTION OF PREFERRED EMBODIMENTS

Preferred embodiments of the present invention will be described below in detail with reference to the drawings.

Figure 1:
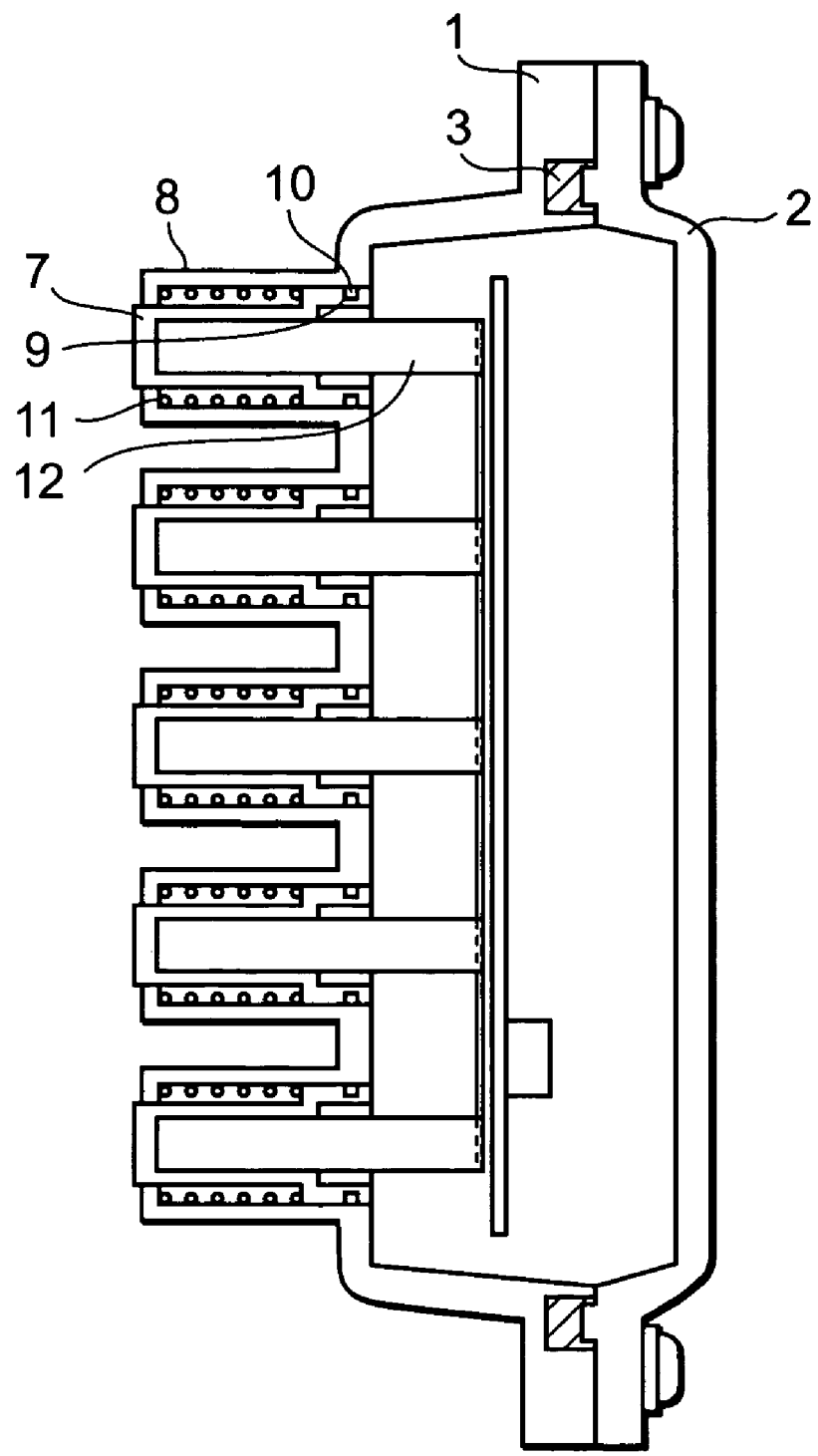
FIG. 1 is a first sectional view showing a housing structure according to a first preferred embodiment of the present invention.
Figure 2:
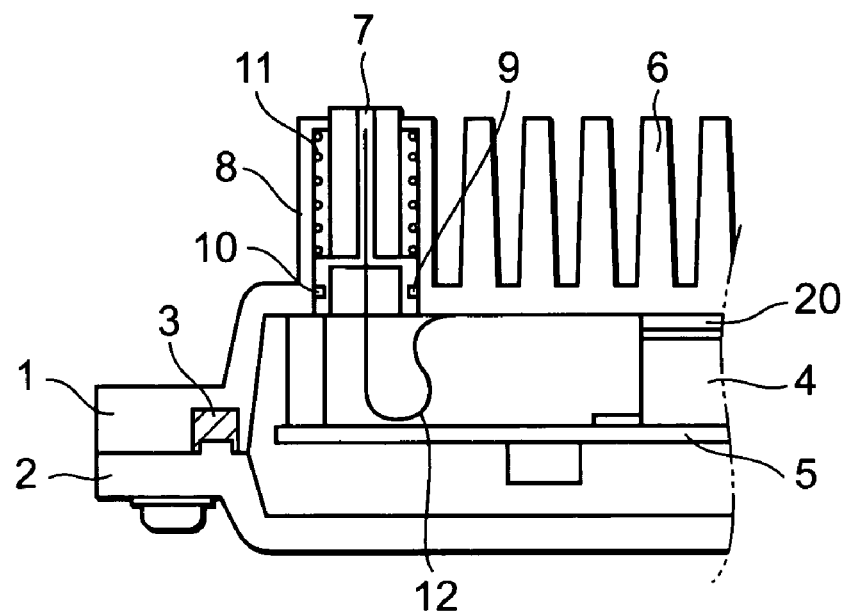
FIG. 2 is a second sectional view showing the housing structure according to the first preferred embodiment of the present invention.
Figure 3:
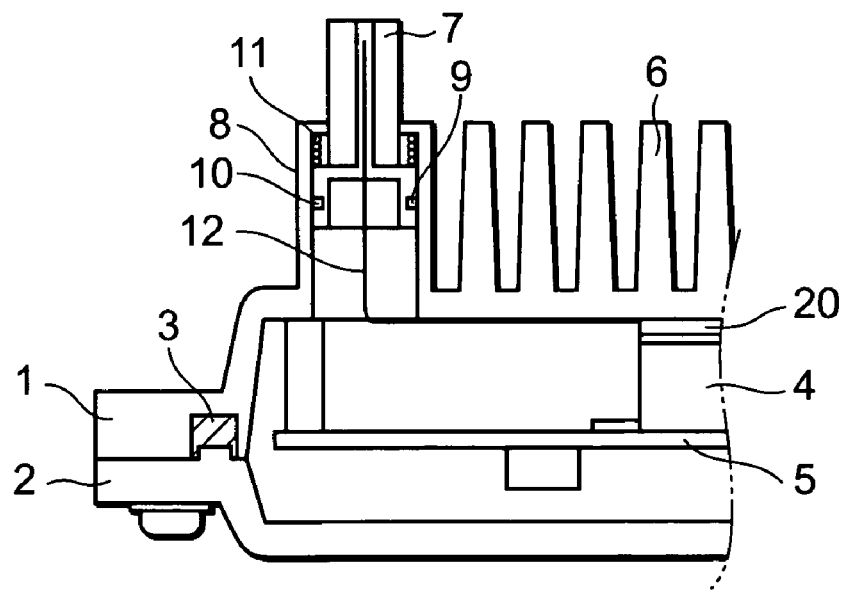
FIG. 3 is a third sectional view showing the housing structure according to the first preferred embodiment of the present invention.

Sectional views of the first preferred embodiment are shown in FIGS. 1, 2, and 3. FIGS. 2 and 3 each show part of a section view of a portion, in a depth direction thereof, including a movable fin 7 in FIG. 1. A body 1 and a cover 2 are joined together via a packing 3 to form a sealed housing.

The sealed housing is provided therein with a board 5 attached with a package 4 or the like having electrical circuit components mounted therein.

In order to radiate heat generated by the electrical circuit components, the package 4 is tightly brought into contact with the inner periphery of heat radiation fins 6 forming part of the inner periphery of the body 1, via a heat conductive member 20.

The body 1 is provided with guide portions 8, and it is configured that the movable fin 7 in each guide portion 8 is smoothly guided by the guide portion 8 to slide depending on a change (increase/decrease) in atmospheric pressure inside the housing.

Airtightness means is provided for shielding between the outside and the inside of the housing to thereby keep airtightness within the housing. Specifically, an O-ring 10 is disposed in a groove 9 formed on the circumference of a root portion of each movable fin 7, and airtightness between the guide portion 8 and the movable fin 7 is ensured by the O-ring 10.

Further, a spring 11 is disposed between the movable fin 7 and an inner surface of the guide portion 8 for the purpose of keeping a balance between the weight of the movable fin 7 and the atmospheric pressure inside the housing such that the movable fin 7 is moved in a direction to return to a position in FIG. 2 when the atmospheric pressure becomes relatively lower. As shown in FIG. 1, a plurality of structures each comprising the movable fin 7, the guide portion 8, and the airtightness means are provided depending on a heat radiation capacity required for the housing.

In order to efficiently conduct heat of the guide portion 8 to the movable fin 7, a high-heat connecting material such as silicone grease is applied between the guide portion 8 and the movable fin 7. For the purpose of further increasing the heat conduction efficiency, a flexible sheet 12 having an excellent property of heat conduction is provided so as to connect between a heat generating portion of the package 4 or the like and the movable fin 7. Specifically, as shown in FIG. 2, for example, the flexible sheet 12 has one end sandwiched between the inner periphery of the heat radiation fins 6 and the package 4, and the other end buried at the center of the movable fin 7, thereby to conduct heat between the heat radiation fins 6 and the movable fin 7. An intermediate portion of the flexible sheet 12 connecting between the foregoing both ends thereof is loosely formed so as to allow the movable fin 7 to move to the outside of the housing.

An operation of the first preferred embodiment will be described using FIGS. 1, 2, and 3.

Referring to FIGS. 1 and 2, when a communication device is in operation, heat generated in the package 4 inside the sealed housing is conducted to the inner periphery of the heat radiation fins 6 of the body 1. Then, the heat conducted to the heat radiation fins 6 is partly radiated by a heat radiating action of the heat radiation fins 6, and partly conducted to the movable fin 7 from the guide portion 8 by the flexible sheet 12 so as to be radiated by heat exchange between the movable fin 7 and the outside air. In this embodiment, when the atmospheric pressure inside the sealed housing increases due to a change in external environment or internal calorific value of the housing, a force exerting to force out the housing inner side of the movable fin 7 against the spring 11 increases so that the movable fin 7 is moved toward the outside of the housing. Consequently, as shown in FIG. 3, the outer periphery of the movable fin 7 is largely exposed to the outside of the housing. In this manner, the heat radiation area of the housing relative to the outside air substantially increases correspondingly to the exposed area of the movable fin 7 so that the heat radiation effect increases correspondingly thereto.

Specifically, even in the state where the flexible sheet 12 is extended by the movement of the movable fin 7 (FIG. 3), the heat conducted from the heat generator to the flexible sheet 12 in the housing is transmitted through the center of the movable fin 7, and therefore, the heat radiation by the movable fin 7 is improved in efficiency.

On the other hand, when the temperature inside the housing drops from the high temperature state as shown in FIG. 3, the pressure forcing out the inner side of the movable fin 7 is weakened and, when a biasing force of the spring 11 exceeds such a pressure, the movable fin 7 is moved in the direction to return to the state of FIG. 2. In this manner, the atmospheric pressure inside the housing is automatically adjusted to keep a balance with the spring 11 by moving the movable fin 7. During the movement of the movable fin 7, the O-ring 10 serves to provide shielding between the outside air and the inner air and also prevent invasion of water from the exterior.

Figure 4:
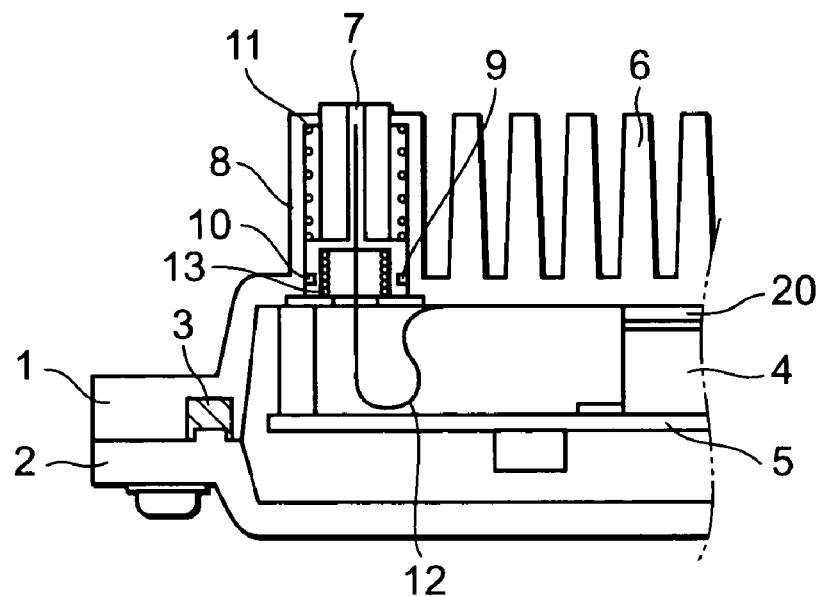
FIG. 4 is a first sectional view showing a housing structure according to a second preferred embodiment of the present invention.

Now, the second preferred embodiment of the present invention will be described referring to FIGS. 4 and 5.

In this embodiment, a restorable member 13 that returns to its original shape at a set temperature is disposed between a movable fin 7 and a guide portion 8, and the other structure is the same as that in the foregoing first preferred embodiment. The restorable member 13 is so configured as to have an extended spring shape as shown in FIG. 5 at high temperature, and have a contracted spring shape as shown in FIG. 4 at normal temperature.

Figure 5:
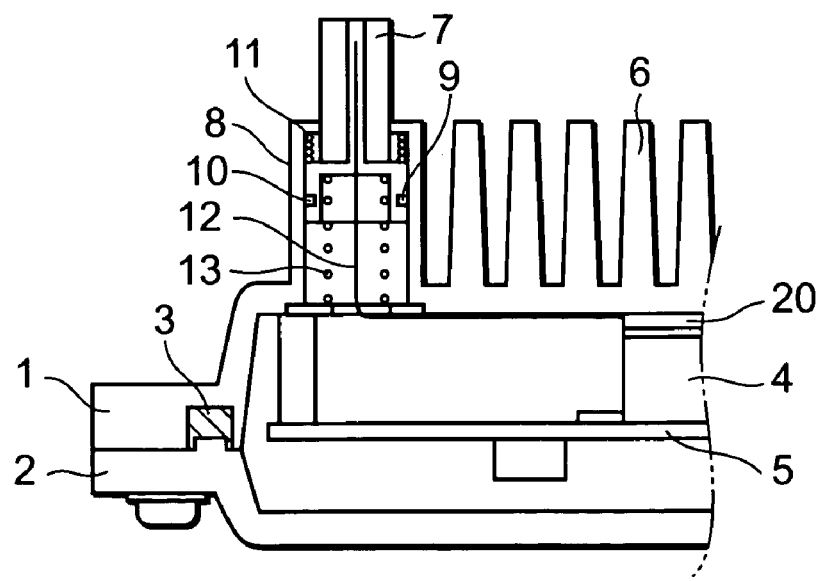
FIG. 5 is a second sectional view showing the housing structure according to the second preferred embodiment of the present invention.

During operation of a communication device, when the temperature inside a housing rises, the restorable member 13 returns toward its original shape while pushing the movable fin 7 toward the outside of the guide portion 8 against a spring 11 like in the foregoing first preferred embodiment and, when the temperature inside the housing reaches the preset temperature, the restorable member 13 achieves the state of FIG. 5. In this embodiment, the movable fin 7 is moved to keep a balance between urging forces of the spring 11 and the restorable member 13.

In this manner, the outer periphery of the movable fin 7 is largely exposed to the outside air in the high temperature state, and therefore, like in the foregoing first preferred embodiment, the substantial heat radiation area increases to thereby efficiently carry out heat radiation. Further, since it is possible to lower the atmospheric pressure inside the housing correspondingly to an internal space that is enlarged by the movement of the movable fin 7, the internal pressure in the high temperature state can be resultantly adjusted.

Incidentally, in the second preferred embodiment, it is not necessarily required to provide the spring 11. In this case, the position of the movable fin 7 is adjusted by the action of the restorable member 13 according to a variation in temperature inside the housing.

Figure 6:
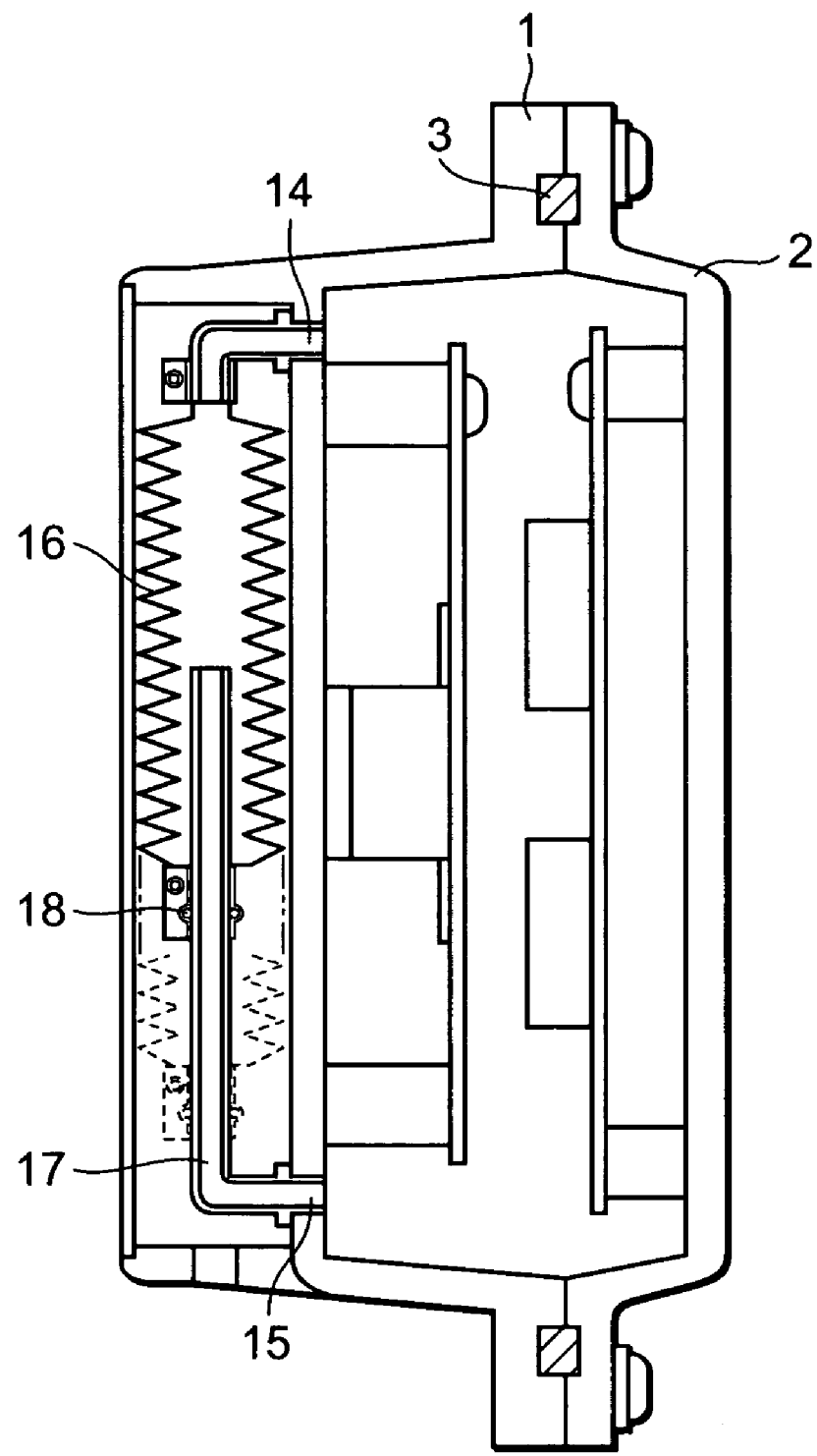
FIG. 6 is a sectional view showing a housing structure according to a third preferred embodiment of the present invention.

Now, the third preferred embodiment of the present invention will be described referring to FIG. 6. In FIG. 6, a sealed housing is formed in its upper part with a first hole 14 through which relatively high temperature air having ascended passes, and further formed in its lower part with a second hole 15. A bellows container 16 with a variable internal volume has an upper end joined to the first hole 14. A tube 17 has one end joined to the second hole 15. At the other end thereof, the tube 17 is inserted into a lower end of the container 16 via an O-ring 18 interposed therebetween for allowing the container 16 to move while ensuring airtightness and watertightness.

In this structure, when the atmospheric pressure inside the housing increases following a temperature rise, relatively high temperature air in the housing enters the container 16 via the first hole 14, so that, as shown by broken lines in FIG. 6, the container 16 is expanded in a direction in which the O-ring 18 moves downward along the tube 17, to thereby increase its internal volume. As a result, the atmospheric pressure inside the sealed housing is adjusted. On the other hand, heat of the air having entered the container 16 is radiated to the outside air, so that the air of which the temperature has dropped moves downward to enter the housing via the second hole 15. Consequently, when the temperature inside the housing drops to lower the atmospheric pressure therein, the internal volume of the container 16 is decreased.

Figure 7:
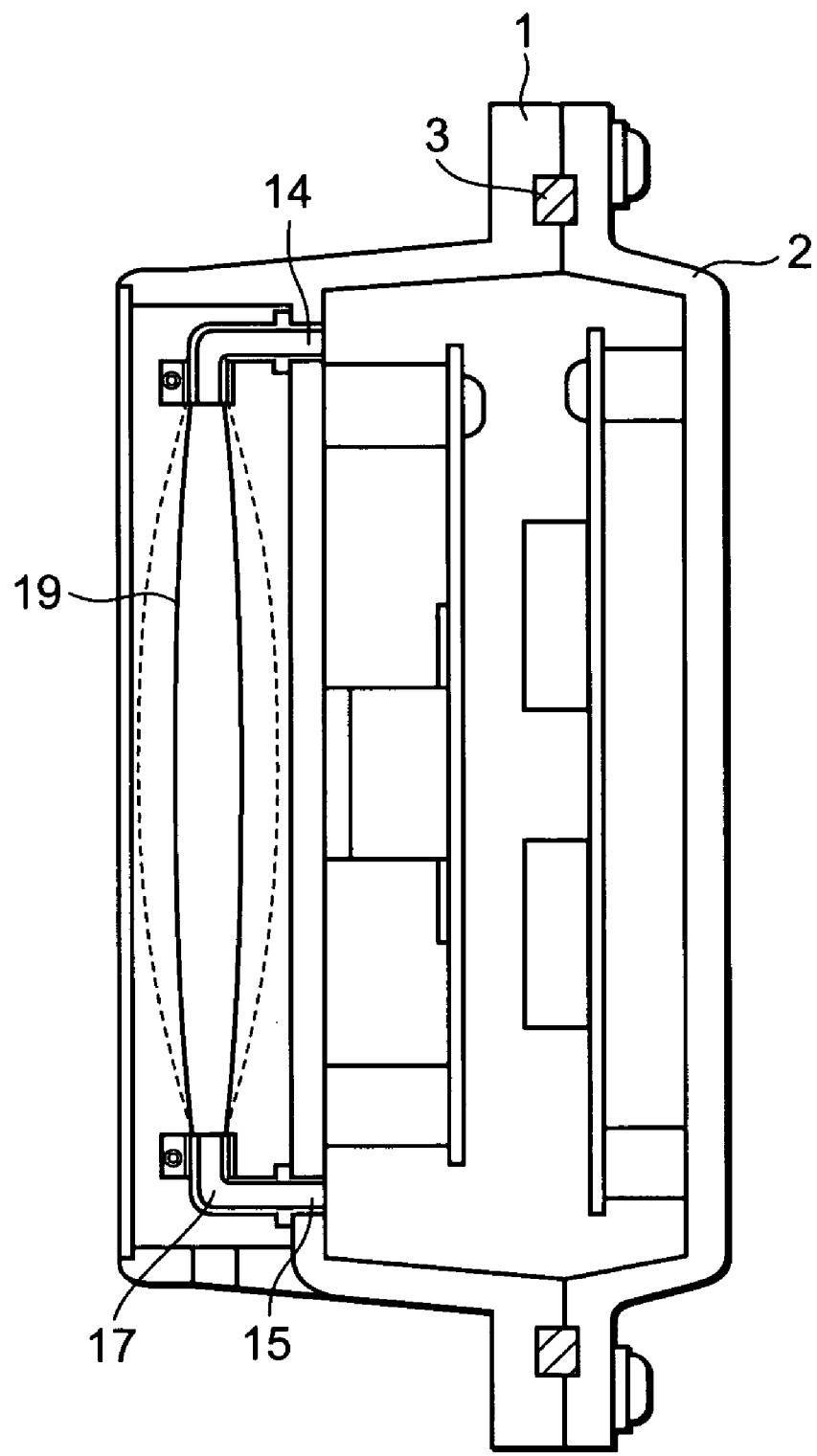
FIG. 7 is a sectional view showing a housing structure according to a fourth preferred embodiment of the present invention.

Further, the fourth preferred embodiment of the present invention will be described referring to FIG. 7. In FIG. 7, instead of the container 16 in the foregoing third preferred embodiment, an expandable/contractible balloon 19 is connected between the first hole 14 and the second hole 15. In this structure, like in the third preferred embodiment, when the atmospheric pressure inside the housing increases following a temperature rise, relatively high temperature air in the housing enters the balloon 19 via the first hole 14, so that, as shown by broken lines in FIG. 7, the internal volume of the balloon 19 increases following the increase in atmospheric pressure inside the housing. Then, heat of the air having entered the balloon 19 is radiated to the outside air, and the temperature-lowered air moves downward to return into the housing via the second hole 15. As a result, the atmospheric pressure inside the sealed housing is adjusted like in the foregoing third preferred embodiment. When the temperature inside the housing drops to lower the atmospheric pressure therein, the balloon 19 is contracted.

As described above, according to the present invention, it is configured that the movable fin is provided, and is automatically slidable toward the inside or outside of the sealed housing depending on a change in atmospheric pressure following a change in temperature inside the sealed housing. Therefore, when the inside temperature rises, it is possible to increase the heat radiation area while keeping the sealing tightness, so that the heat radiation effect can be enhanced. Consequently, since it is possible to prevent invasion of poisonous gas outside the housing or the high humidity outside air, the reliability of the electronic device such as the communication device can be enhanced.

Further, according to the present invention, it is configured that the bellows container with the variable internal volume or the expandable/contractible balloon is provided, and that the internal volume of the bellows container or the balloon is changed depending on a change in atmospheric pressure following a change in temperature inside the sealed housing. Therefore, the atmospheric pressure inside the sealed housing is adjusted. Consequently, since it is possible to prevent invasion of poisonous gas outside the housing or the high humidity outside air, the reliability of the electronic device such as the communication device can be enhanced. Further, since the high temperature air enters the bellows container or the balloon, then, heat of the air having entered is radiated to the outside air, and then, the temperature-lowered air returns into the housing, it is possible to enhance the heat radiation effect while keeping the sealing tightness.

While the present invention has been described in connection with certain preferred embodiments, it is to be understood that the subject matter encompassed by way of this invention is not to be limited to those specific embodiments. On the contrary, it is intended for the subject matter of the invention to include all alternatives, modifications and equivalents as can be included within the spirit and scope of the following claims.

What is claimed is:

1. An electronic device comprising:
   an airtight sealed housing sealing a fixed amount of air within the housing;
   an electrical circuit component in said sealed housing; and
   a movable fin that protrudes to the outside of said sealed housing, outward movement of the fin being caused by a rise in internal temperature of said sealed housing.

2. An electronic device as claimed in claim 1, wherein, said movable fin protrudes to the outside of said sealed housing through a guide hole formed in said sealed housing, and has airtightness means between itself and said guide hole, and
   the outward movement of the fin depends on an atmospheric pressure increase inside the sealed housing acting against a housing inner side of the fin.

3. An electronic device as claimed in claim 2, wherein a heat generating portion of a package or the like mounted therein with said electrical circuit component and said movable fin are connected to each other by a flexible sheet, and
   further comprising a return spring located intermediate the housing and the fin, the return spring acting to move the fin into the housing.

4. An electronic device as claimed in claim 2, wherein said movable fin is caused to protrude to the outside of said sealed housing by a member that returns to its original shape at a set temperature.

5. An electronic device as claimed in claim 3, wherein said movable fin is caused to protrude to the outside of said sealed housing by a member that returns to its original shape at a set temperature.

6. An electronic device as claimed in claim 1, wherein a heat generating portion of a package or the like mounted therein with said electrical circuit component and said movable fin are connected to each other by a flexible sheet, and
   an internal calorific value increase of the housing causes an atmospheric pressure increase inside the sealed housing and the increased atmospheric pressure acts against a housing inner side of the fin to provide a force causing the outward movement of the fin.

7. An electronic device as claimed in claim 6, wherein said movable fin is caused to protrude to the outside of said sealed housing by a member that returns to its original shape at a set temperature.

8. An electronic device as claimed in claim 1, wherein said movable fin is caused to protrude to the outside of said sealed housing by a member that returns to its original shape at a set temperature.

9. A heat radiation method for an electronic device having a sealed housing, wherein, when an internal temperature of said sealed housing having therein an electrical circuit component rises, a movable fin is caused to protrude to the outside of said sealed, housing, wherein, an internal calorific value increase of the housing causes an atmospheric pressure increase inside the sealed housing and the increased atmospheric pressure acts against a housing inner side of the fin to provide a force causing the outward movement of the fin.

10. A heat radiation method for an electronic device having a sealed housing as claimed in claim 9, wherein said movable fin is caused to protrude through a guide hole formed in said sealed housing, while keeping airtightness.

11. A heat radiation method for an electronic device having a sealed housing as claimed in claim 10, wherein heat of a package or the like mounted therein with said electrical circuit component is conducted to said movable fin by a flexible sheet.

12. A heat radiation method for an electronic device having a sealed housing as claimed in claim 10, wherein said movable fin is further caused to protrude by deformation of a member due to a temperature increase in said member, said member adapted to return to its original shape upon a following decrease in the temperature of said member.

13. A heat radiation method for an electronic device having a sealed housing as claimed in claim 11, wherein said movable fin, is further caused to protrude by deformation of a member due to a temperature increase in said member, said member adapted to return to its original shape.

14. A heat radiation method for an electronic device having a sealed housing as claimed in claim 9, wherein heat of a package or the like mounted therein with said electrical circuit component is conducted to said movable fin by a flexible sheet.

15. A heat radiation method for an electronic device having a sealed housing as claimed in claim 14, wherein said movable fin is further caused to protrude by deformation of a member due to a temperature increase of said member, said member adapted to return to its original shape.

16. A heat radiation method for an electronic device having a sealed housing as claimed in claim 9, wherein said movable fin is further caused to protrude by deformation of a member due to a temperature increase of said member, said member adapted to return to its original shape upon a following decrease in the temperature of said member.

17. A sealed airtight housing of an electronic device, comprising:
a sealed airtight housing sealing a fixed amount of air within the housing;
a guide hole within an exterior surface of the housing; and
a movable fin that protrudes to the outside of the housing through said guide hole, the outward movement of the fin depending on a rise in internal pressure of the fixed amount of air, the rise in internal pressure caused by a rise in internal temperature of said sealed housing.

18. A sealed housing of an electronic device as claimed in claim 17, wherein said movable fin has airtightness means between itself and said guide hole.

19. A sealed housing of an electronic device as claimed in claim 18, further comprising a flexible sheet connecting between a heat generating portion mounted in said sealed housing and said movable fin.

20. A sealed housing of an electronic device as claimed in claim 18, wherein said movable fin is further caused to protrude to the outside by a member that returns to its original shape at a set temperature.

21. A sealed housing of an electronic device as claimed in claim 19, wherein said movable fin is further caused to protrude to the outside by a member that returns to its original shape at a set temperature.

22. A sealed housing of an electronic device as claimed in claim 17, further comprising a flexible sheet connecting between a heat generating portion mounted in said sealed housing and said movable fin.

23. A sealed housing of an electronic device as claimed in claim 22, wherein said movable fin is further caused to protrude to the outside by a member that returns to its original shape at a set temperature.

24. A sealed housing of an electronic device as claimed in claim 17, wherein said movable fin is further caused to protrude to the outside by a member that returns to its original shape at a set temperature.

25. An electronic device, comprising:
an airtight sealed housing sealing a fixed amount of air within the housing;
an electrical circuit component in said sealed housing; and
a movable heat radiation fin that protrudes to the outside of the sealed housing, outward movement of the fin being caused by a rise in internal pressure of the sealed air acting on a housing inside surface of the fin, wherein,
heat generated by the electrical circuit component causes an increase of an internal temperature of the sealed housing and the increased internal temperature of the sealed housing causes the increase in internal pressure of the sealed air.

26. An electronic device, comprising:
a body and a cover joined together via a packing to form a sealed housing that airtight seals a fixed amount of air within the housing;
a board, attached with a package having electrical circuit components mounted thereon, mounted to the housing;
movable heat radiation fins that protrude to the outside of the sealed housing, outward movement of the fins being caused by a rise in internal pressure of the sealed air acting on a housing inside surface of the fin; and
a heat conductive member, wherein, the package is in contact with an inner periphery of heat radiation fins forming part of an inner periphery of the body, via the heat conductive member, the contact providing a path to radiate heat generated by the electrical circuit components, and
heat generated by the electrical circuit component causes an increase of an internal temperature of the housing and the increased internal temperature of the sealed housing causes the increase in internal pressure of the sealed air.

27. An electronic device, comprising:
a body and a cover joined together via a packing to form a sealed housing that airtight seals a fixed amount of air within the housing;
a board, attached with a package having electrical circuit components mounted thereon, mounted to the housing;
movable heat radiation fins that protrude to the outside of the sealed housing, outward movement of the fins being caused by a rise in internal pressure of the sealed air acting on a housing inside surface of the fins; and
a heat conductive member, wherein,
the package is in contact with an inner periphery of heat radiation fins forming part of an inner periphery of the body, via the heat conductive member, the contact providing a path to radiate heat generated by the electrical circuit components.

28. An electronic device, comprising:
a body and a cover joined together and forming a sealed housing that airtight seals a fixed amount of air within the housing;
a board, attached with a package having electrical circuit components mounted thereon, mounted to the housing; and
movable heat radiation fins protruding through an outside of the cover, outward movement of the fins being caused by a rise in an internal pressure acting on a housing inside surface of the fins.

29. The device of claim 28, further comprising:
return springs located intermediate the cover and each fin, the return springs acting to move the fins into the housing.

* * * * *